(12) United States Patent
Hiroshiro et al.

(10) Patent No.: US 11,049,723 B2
(45) Date of Patent: Jun. 29, 2021

(54) SUBSTRATE PROCESSING METHOD AND SUBSTRATE PROCESSING APPARATUS

(71) Applicant: Tokyo Electron Limited, Tokyo (JP)

(72) Inventors: Koukichi Hiroshiro, Kumamoto (JP); Rintaro Higuchi, Kumamoto (JP); Koji Kagawa, Kumamoto (JP); Kenji Sekiguchi, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/736,964

(22) Filed: Jan. 8, 2020

(65) Prior Publication Data

US 2020/0219730 A1 Jul. 9, 2020

(30) Foreign Application Priority Data

Jan. 9, 2019 (JP) .............................. JP2019-001564

(51) Int. Cl.
| | |
|---|---|
| *H01L 21/306* | (2006.01) |
| *H01L 21/67* | (2006.01) |
| *B82Y 40/00* | (2011.01) |
| *C23C 16/04* | (2006.01) |
| *G03F 7/16* | (2006.01) |

(Continued)

(52) U.S. Cl.
CPC ........ *H01L 21/30604* (2013.01); *B82Y 30/00* (2013.01); *B82Y 40/00* (2013.01); *C23C 16/04* (2013.01); *G03F 7/165* (2013.01); *H01L 21/0201* (2013.01); *H01L 21/02057* (2013.01); *H01L 21/02071* (2013.01); *H01L 21/02107* (2013.01); *H01L 21/302* (2013.01); *H01L 21/321* (2013.01); *H01L 21/6704* (2013.01); *H01L 21/6708* (2013.01); *H01L 21/67011* (2013.01); *H01L 21/67023* (2013.01); *H01L 21/67028* (2013.01); *H01L 21/67103* (2013.01); *H01L 21/67248* (2013.01)

(58) Field of Classification Search
None
See application file for complete search history.

(56) References Cited

FOREIGN PATENT DOCUMENTS

| | | | | |
|---|---|---|---|---|
| EP | 1670054 | * | 6/2006 | ........... H01L 21/768 |
| JP | 2013-251379 A | | 12/2013 | |

OTHER PUBLICATIONS

J.C. Love et al., "Self-Assembled Monolayers of Thiolates on Metals as a Form of Nanotechnology", Chem. Rev. vol. 105, pp. 1103-1160. (Year: 2005).*

* cited by examiner

*Primary Examiner* — Jiong-Ping Lu
(74) *Attorney, Agent, or Firm* — Abelman, Frayne & Schwab

(57) ABSTRACT

A substrate processing method includes: maintaining an atmosphere in contact with at least a surface of a substrate on which a first material that is a metal and a second material that is a material other than the first material are exposed, as a deoxidized atmosphere; supplying a film forming material, which selectively forms a film on the first material among the first material and the second material, to the surface of the substrate in a state where the deoxidized atmosphere is maintained by the maintaining; performing a surface treatment of the second material in a state where the film is formed on a surface of the first material supplied in the supplying the film forming material; and removing the film from the surface of the first material after the performing the surface treatment.

10 Claims, 8 Drawing Sheets

(51) Int. Cl.
*H01L 21/302* (2006.01)
*B82Y 30/00* (2011.01)
*H01L 21/02* (2006.01)
*H01L 21/321* (2006.01)

| OXYGEN CONCEN-TRATION (ppm) | PROCESSING TEM-PERATUR (°C) | ODT SUPPLYING TIME (min) | CONTACT ANGLE(°) | | | |
|---|---|---|---|---|---|---|
| | | | BEFORE SUPPLYING ODT | AFTER SUPPLYING ODT | AFTER RINSING | AFTER SUPPLYING DTT |
| 200 | ROOM TEM-PERATURE | 1 | 40 | 95 | – | – |
| 10 | ROOM TEM-PERATURE | 1 | 40 | 102 | 90 | 43 |
| 10 | 36 | 1 | 40 | 109 | 109 | 46 |

SUBSTRATE PROCESSING METHOD AND SUBSTRATE PROCESSING APPARATUS

CROSS-REFERENCE TO RELATED APPLICATIONS

This application is based on and claims priority from Japanese Patent Application No. 2019-001564, filed on Jan. 9, 2019 with the Japan Patent Office, the disclosure of which is incorporated herein in its entirety by reference.

TECHNICAL FIELD

The present disclosure relates to a substrate processing method and a substrate processing apparatus.

BACKGROUND

There has been known a technique in the related art for selectively processing an arbitrary material when a plurality of types of materials are exposed on the surface of a substrate such as, for example, a semiconductor wafer (see, e.g., Japanese Patent Laid-Open Publication No. 2013-251379).

SUMMARY

A substrate processing method according to an aspect of the present disclosure includes a maintaining step, a supplying step, a surface treatment step, and a removing step. In the maintaining step, an atmosphere, which is in contact with at least the surface of a substrate on which a first material that is a metal and a second material that is a material other than the first material are exposed, is maintained in a deoxidized atmosphere. In the supplying step, a film forming material, which selectively forms a film with respect to the first material and the second material, is supplied to the surface of the substrate in the state in which the substrate is maintained in the deoxidized atmosphere by the maintaining step. In the surface treatment step, a surface treatment of the second material is performed in the state in which the film is formed on the surface of the first material by the supplying step. In the removing step, the film is removed from the surface of the first material after the surface treatment step.

The foregoing summary is illustrative only and is not intended to be in any way limiting. In addition to the illustrative aspects, embodiments, and features described above, further aspects, embodiments, and features will become apparent by reference to the accompanying drawings and the following detailed description.

DESCRIPTION OF EMBODIMENT

Figure 1:
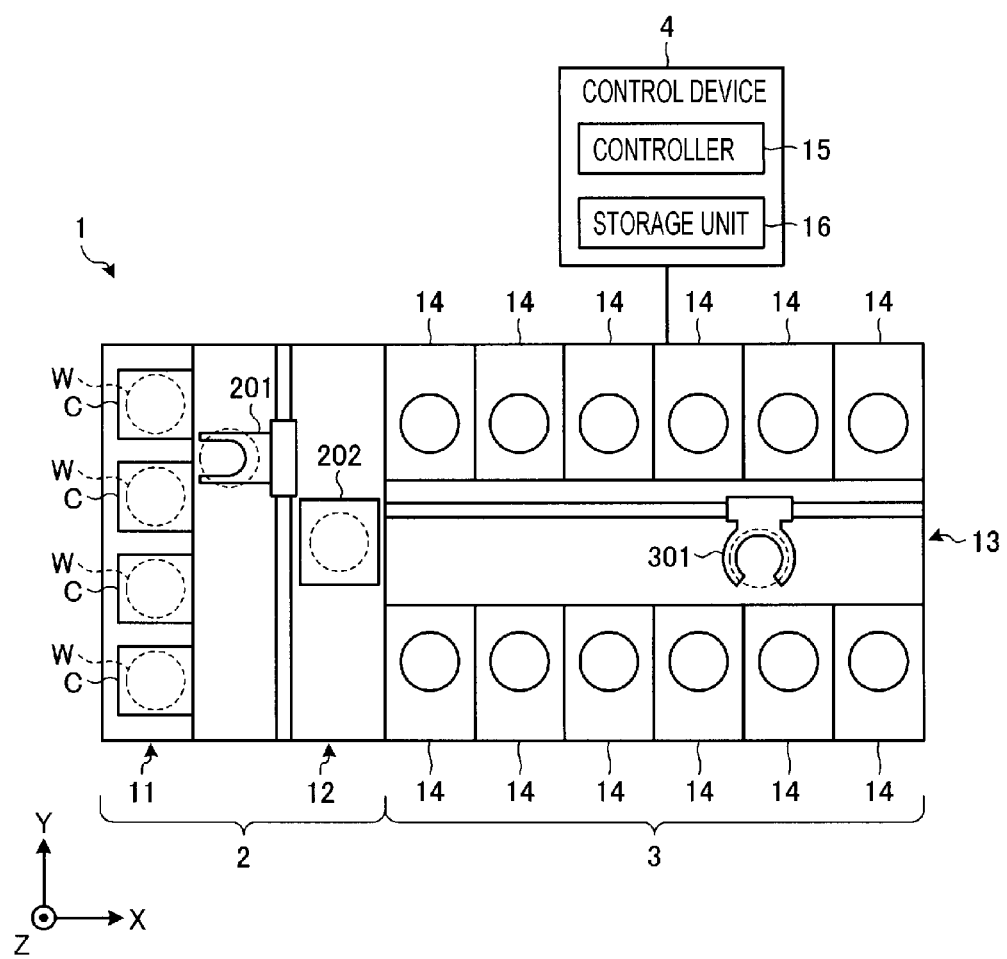
FIG. 1 is a view illustrating a configuration of a substrate processing system according to an embodiment.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, modes for implementing a substrate processing apparatus and a substrate processing method according to the present disclosure (hereinafter, referred to as "embodiments") will be described in detail with reference to the accompanying drawings. The substrate processing apparatus and the substrate processing method according to the present disclosure are not limited by these embodiments. In addition, it is possible to appropriately combine respective embodiments as long as the processing contents do not contradict each other. In each of the following embodiments, the same components will be denoted by the same reference numerals, and redundant descriptions will be omitted.

In the drawings to be referred to below, in order to make the description easy to understand, an orthogonal coordinate system may be defined in which the X-axis direction, the Y-axis direction, and the Z-axis direction are orthogonal to each other, and the positive direction in the Z axis is a vertically upward direction.

(1. Configuration of Substrate Processing System)

Figures 2, 3:
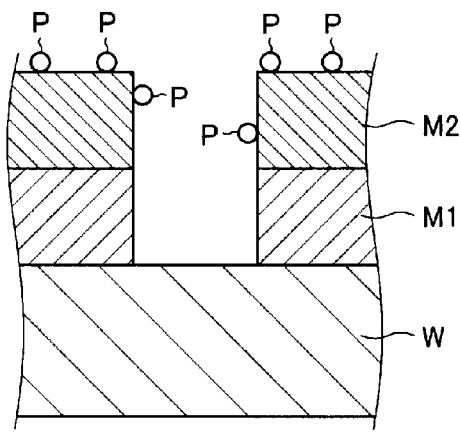
FIG. 2 is a view illustrating a configuration of a wafer according to the embodiment.
FIG. 3 is a view representing test results concerning a film forming processing according to an embodiment.

First, a configuration of a substrate processing system according to an embodiment will be described. FIG. 1 is a view illustrating a configuration of a substrate processing system according to an embodiment. In addition, FIG. 2 is a view illustrating a configuration of a wafer according to the embodiment. In the following description, in order to clarify a positional relationship, the X axis, the Y axis, and the Z axis which are orthogonal to each other are defined, and the Z-axis positive direction is defined as a vertically upward direction.

As illustrated in FIG. 1, a substrate processing system 1 includes a loading/unloading station 2, and a processing station 3. The loading/unloading station 2 and the processing station 3 are provided adjacent to each other.

The loading/unloading station 2 includes a carrier placing section 11 and a transfer section 12. In the carrier placing section 11, a plurality of transfer containers (hereinafter referred to as "carriers C") that are capable of accommodate a plurality of wafers W in a horizontal state are disposed.

The transfer section 12 is provided adjacent to the carrier placing section 11. Inside the carrier section 12, a substrate transfer device 201 and a delivery unit 202 are disposed.

The substrate transfer device 201 includes a wafer holding mechanism configured to hold a wafer W. In addition, the substrate transfer device 201 is capable of moving in the horizontal direction and vertical direction and rotating about the vertical axis, and transfers wafers W between the carriers C and the delivery unit 202 using a wafer holding mechanism.

The processing station 3 is provided adjacent to the transfer section 12. The processing station 3 includes a transfer section 13 and a plurality of substrate processing apparatuses 14. The plurality of substrate processing apparatuses 14 are arranged side by side on the opposite sides of the transfer section 13.

The transfer section 13 includes a substrate transfer apparatus 13 therein. The substrate transfer device 301 includes a wafer holding mechanism configured to hold a wafer W. In addition, the substrate transfer device 301 is capable of moving in the horizontal direction and vertical direction and rotating about the vertical axis, and transfers wafers W between the delivery unit 202 and the substrate processing apparatuses 14 using a wafer holding mechanism.

The substrate processing apparatuses 14 perform a wet etching processing on wafers W. The wet etching processing is performed to remove reaction products generated by, for example, dry etching.

The substrate processing system 1 includes a control device 4. The control device 4 is a device that controls the operation of the substrate processing system 1. The control device 4 is, for example, a computer, and includes a controller 15 and a storage unit 16. The storage unit 16 stores a program for controlling various processings such as an etching processing. The controller 15 controls the operation of the substrate processing system 1 by reading and executing the program stored in the storage unit 16. The controller is, for example, a central processing unit (CPU) or a microprocessor unit (MPU), and the storage unit 16 is, for example, a (read only memory (ROM) or a random access memory (RAM).

In addition, such a program may be stored in a computer-readable storage medium by a computer and installed in the storage unit 16 of the control device 4 from the storage medium. The computer-readable storage medium includes, for example, a hard disk (HD), a flexible disk (FD), a compact disk (CD), a magneto optical disk (MO), and a memory card.

In the substrate processing system 1 configured as described above, first, the substrate transfer device 201 of the loading/unloading station 2 takes out a wafer W from a carrier C placed on the carrier placing section 11 and places the taken-out wafer W on the delivery unit 202. The wafer W placed on the delivery unit 202 is taken out from the delivery unit 202 and carried into a substrate processing apparatus 14 by the substrate transfer device 301 and a processing is performed by the substrate processing apparatus 14. The processed wafer W is unloaded from the substrate processing apparatus 14 by the substrate transfer device 301, placed on the delivery unit 202, and then returned to the carrier C by the substrate transfer device 201.

(2. Concerning Substrate Processing)

As illustrated in FIG. 2, a wafer W according to the embodiment is, for example, a silicon wafer or a compound semiconductor wafer, and a first material M1 and a second material M2 are exposed on the surface of thereof.

The first material M1 constitutes, for example, one layer in a pattern and is made of a metallic material. In the embodiment, the first material M1 is any one of gold, silver, copper, platinum, palladium, iron, nickel, zinc, cobalt, and ruthenium. The first material M1 may be an alloy containing at least one of gold, silver, copper, platinum, palladium, iron, nickel, zinc, cobalt, and ruthenium. The first material M1 may include a non-metallic material such as, for example, silicon in addition to the metallic material.

The second material M2 constitutes, for example, one layer in the pattern and is made of a non-metallic material. For example, the second material M2 is an interlayer insulating film and is made of a silicon-based material such as, for example, a silicon oxide film, a silicon thermal-oxide film, a silicon nitride film, or a silicon oxynitride film. The second material M2 does not necessarily need to be composed of a non-metallic material. For example, the second material M2 may be a metal other than gold, silver, copper, platinum, palladium, iron, nickel, zinc, cobalt, and ruthenium.

A reaction product P generated by, for example, dry etching adheres to the surface of the wafer W. The substrate processing apparatus 14 according to the embodiment removes the reaction product P by a wet etching processing (hereinafter, simply referred to as "etching processing").

When an etching liquid for etching the reaction product P is supplied to the surface of the wafer W, the first material M1 and the second material M2 may be etched. In particular, when the first material M1 includes copper or cobalt, the copper or cobalt is easily corroded, and thus the first material M1 may be removed by the etching liquid.

Accordingly, in the substrate processing apparatus 14 according to the embodiment, prior to the etching processing for removing the reaction product P, a film forming material that selectively forms a film on the surface of the first material M1 is supplied to the wafer W, and the etching processing is performed in the state in which the surface of the first material M1 is protected by a film. This makes it possible to suppress the first material M1 from being removed by the etching liquid.

In the embodiment, a material containing sulfur atoms is used as the film forming material. For example, the film forming material is, for example, thiol ($R^1$—SH), disulfide ($R^2$—S—S—$R^3$), or thiocyanate ($R^4$—SCN). Each of $R^1$ to $R^4$ independently represents a substituted or unsubstituted alkyl group. The substituted alkyl group is, for example, an alkyl group substituted with halogen.

These film forming materials may selectively form a film on the first material M1 by causing sulfur atoms to be bonded to the surface of the first material M1 containing at least one of gold, silver, copper, platinum, palladium, iron, nickel, zinc, cobalt, and ruthenium. In this case, the film formed on the surface of the first material M1 is a monolayer film. Here, the monolayer film is a film in which only one layer of molecules is adsorbed on the surface of an object, in which each molecule is, for example, a molecule having an adsorbable functional group at only one location therein, or only one or both of dissociated portions obtained when one molecule is dissociated are adsorbed. The film formed of the film forming materials may be a multilayer film. The multilayer film is a film formed when molecules are stacked and adsorbed in which each molecule is, for example, a molecule having an adsorbable functional group at a plurality of locations therein.

When an oxide film such as a natural oxide film is formed on the surface of the first material M1, there is a possibility that the film formation using the film forming material is not appropriately performed. Accordingly, in the substrate processing apparatus 14 according to an embodiment, the film forming material is supplied to the surface of the wafer W in the state in which the atmosphere, which is in contact with the surface of the wafer W, is maintained in a deoxidized atmosphere. This makes it possible to suitably form a film on the surface of the first material M1. In this specification, "deoxidized atmosphere" refers to an atmosphere having an oxygen concentration of 50 ppm or less. Specifically, the "deoxidized atmosphere" may be an atmosphere having an oxygen concentration of 10 ppm or less.

In addition, in the substrate processing apparatus 14 according to an embodiment, a processing of supplying a film forming material the surface of the wafer W (hereinafter, referred to as a "film forming processing") is performed in the state in which the temperature of the film forming material or the wafer W is raised to a temperature higher than room temperature (for example, 21° C.). This makes it possible to shorten the time required for the film forming processing. Herein, "temperature higher than room temperature" means a temperature of 25° C. or higher. More specifically, the "temperature higher than room temperature" may be a temperature of 36° C. or higher.

The test results concerning these points are represented in FIG. 3. FIG. 3 is a view representing test results concerning a film forming processing according to an embodiment. The inventors of the present application conducted a test to form a film on the surface of cobalt by supplying octadecanethiol (ODT) as a film forming material to a silicon wafer (hereinafter, referred to as a "sample") having the cobalt exposed on the surface thereof. The ODT was supplied to the sample in a state diluted to 0.01 mol/L with isopropyl alcohol (IPA). The ODT supplying time was 1 minute.

In addition, before supplying the ODT to the sample, the inventors of the present application performed a processing of etching the surface of the cobalt (the natural oxide film) by about 2 nm by supplying an etching liquid (HCl) to the surface of the sample in order to remove a natural oxide film formed on the surface of cobalt.

The processing of supplying the etching liquid to the surface of the sample and the processing of supplying the ODT to the surface of the sample were performed in a glove box in which the oxygen concentration was adjusted. The inventors of the present application performed the above two processings after adjusting the oxygen concentration in the glove box to 200 ppm or 10 ppm by supplying nitrogen into the glove box. The inventors of the present application performed the above two processings at room temperature (21° C.), that is, in a state where the temperature was not raised, and in a state where the temperature was raised to 36° C. The contact angle of the cobalt surface was 40° before supplying the ODT.

As represented in FIG. 3, when the oxygen concentration is set to 200 ppm, the contact angle of the cobalt surface after supplying the ODT is 95°, which is considerably smaller than 109° which is the contact angle when the ODT is completely adsorbed on the surface. Whereas, when the oxygen concentration is set to 10 ppm, the contact angle of the cobalt surface after supplying the ODT is 102° when the processing was performed at room temperature, and 109° when the processing was performed at 36° C. The contact angle after supplying the ODT is greatly increased compared with that before supplying the ODT. From this result, it can be seen that by supplying the ODT in a deoxidized atmosphere, an ODT film is appropriately formed on the cobalt surface in a short time. In addition, the inventors of the present application have performed the same test using an oxygen concentration of 50 ppm and have confirmed that a favorable result is obtained similarly to the case where the oxygen concentration is 10 ppm.

In addition, the inventors of the present application performed a processing of supplying a rinsing liquid to the sample after supplying the ODT. Deionized water (DIW) and IPA were used as the rinsing liquid. As represented in FIG. 3, in the case where the ODT was supplied at an oxygen concentration of 10 ppm and at room temperature, the contact angle of the cobalt surface after supplying the rinsing liquid was 90°. Whereas, in the case where the ODT was supplied at an oxygen concentration of 10 ppm and at 36° C., the contact angle of the cobalt surface after supplying the rinsing liquid was 109°, which was the same as the contact angle before rinsing. From this result, it can be seen that when the ODT is supplied at 36° C., an ODT film is suitably formed on the cobalt surface compared with the case where the ODT is supplied at room temperature. In addition, the inventors of the present application have performed the same test at 25° C. as the processing temperature, and have confirmed that a favorable result is obtained similarly to the case where the processing temperature is 36° C.

The inventors of the present application conducted a test to remove a film formed on a cobalt surface by supplying a reducing agent to the sample after the rinsing liquid was supplied. As the reducing agent, dithiothreitol (DTT) was used. As a result, as represent in FIG. 3, when the ODT was supplied at room temperature, the contact angle on the cobalt surface decreased to 43° and when the ODT was supplied at 36° C., the contact angle of the cobalt surface decreased to 46°. From this result, it can be understood that the film formed on the cobalt surface is satisfactorily removed by using DTT.

As is apparent from the above test results, the film forming processing is preferably performed under a deoxidized atmosphere and under a temperature-raised environment. Moreover, it is preferable to use a reducing agent such as DTT to remove the film formed on the surface of the first material M1. As a mechanism for removing the film with the reducing agent, for example, it is considered that an exchange reaction occurs between the film formed on the surface of the first material M1 and the reducing agent, whereby the film is removed from the surface of the first material M1. In addition to DDT, the reducing agent may be, for example, 2-mercaptoethanol, 2-mercaptoethylamine hydrochloride, and tris(2-carboxyethyl) phosphine hydrochloride (TCEP-HCl).

(3. Configuration of Substrate Processing Apparatus)

Figure 4:
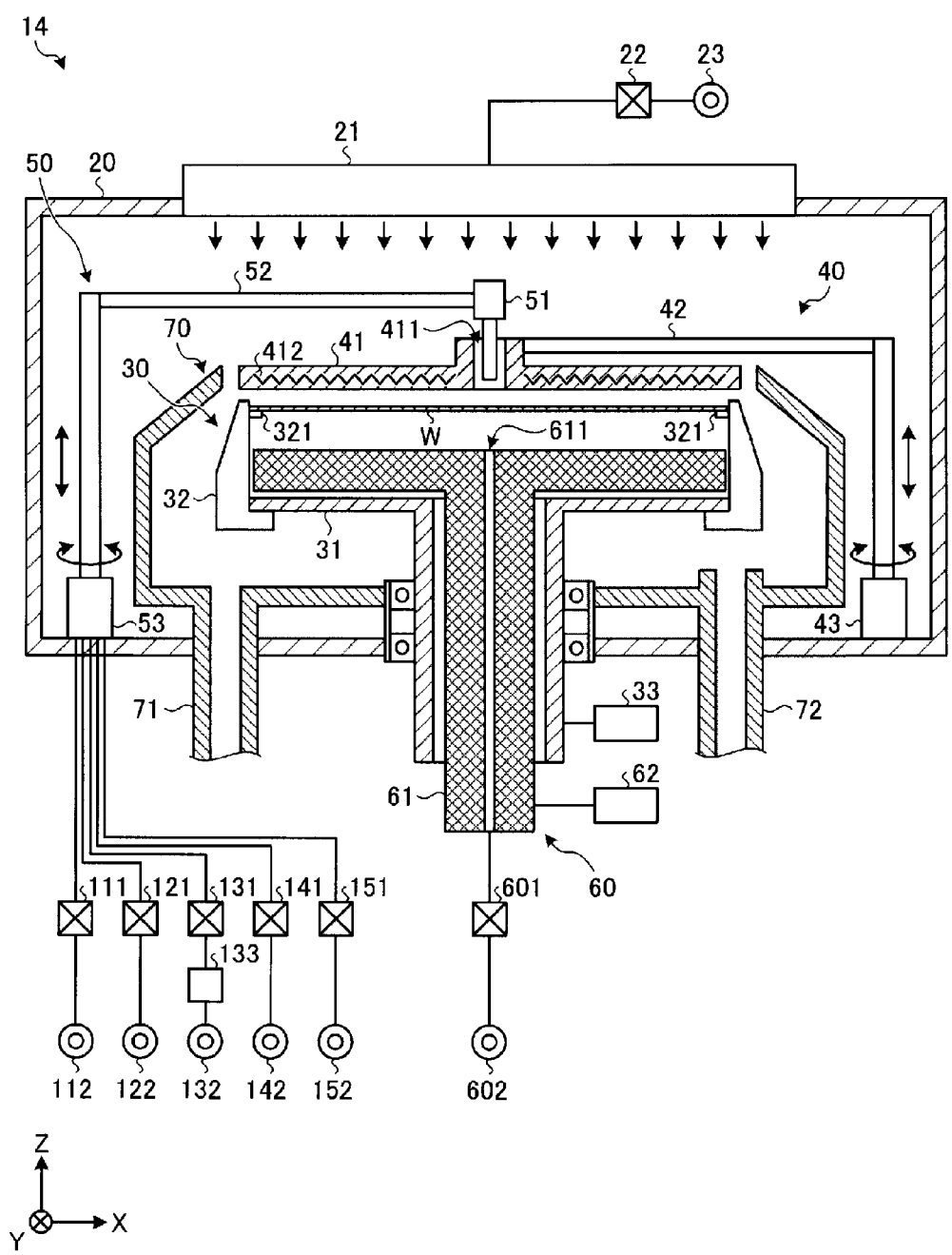
FIG. 4 is a view illustrating a configuration of a substrate processing apparatus according to an embodiment.

Next, an exemplary configuration of a substrate processing apparatus 14 will be described with reference to FIG. 4. FIG. 4 is a view illustrating the configuration of the substrate processing apparatus 14 according to an embodiment.

As illustrated in FIG. 4, the substrate processing apparatus 14 includes a chamber 20, a substrate holding mechanism 30, a deoxidized atmosphere maintaining unit 40, a processing fluid supply unit 50, a lower supply unit 60, and a recovery cup 70.

The chamber 20 accommodates the substrate holding mechanism 30, the deoxidized atmosphere maintaining unit 40, the processing fluid supply unit 50, the lower supply unit 60, and the recovery cup 70. A fan filter unit (FFU) 21 is provided on the ceiling of the chamber 20. The FFU 21 forms a down flow in the chamber 20. Specifically, the FFU 21 is connected to the downflow gas supply source 23 via a valve 22. The FFU 21 ejects a downflow gas (e.g., nitrogen or dry air) supplied from the downflow gas supply source 23 into the chamber 20.

The substrate holding mechanism 30 includes a main body 31 through which an under plate 61 of the lower supply unit 60 to be described later is inserted, and a holding member 32 that is provided in the main body 31 and holds the wafer W in the state of being spaced apart from the under plate 61. The holding member 32 includes a plurality of support pins 321 that support the rear surface of the wafer W, and the support pins 321 holds the wafer W horizontally by supporting the rear surface of the wafer W. The wafer W is supported by the support pins 321 in the state in which the surface on which the first material M1 and the second material M2 are formed faces upward.

In addition, the substrate holding mechanism 30 includes a drive unit 33 that rotates the main body 31 around the vertical axis. The substrate holding mechanism 30 is capable of rotating the wafer W held by the holding member 32 around the vertical axis by rotating the main body 31 using the drive unit 33.

The substrate holding mechanism 30 is not limited to the type that supports the wafer W from the lower side as described above, but may be a type that holds the wafer W from the lateral side or may be a type that suctions and holds the wafer W from the lower side like a vacuum chuck.

The deoxidized atmosphere maintaining unit 40 includes a top plate 41, an arm 42 that horizontally supports the top plate 41, and a drive unit 43 that turns and moves up and down the arm 42.

The top plate 41 is formed to have a size that covers the surface of the wafer W. An opening 411 through which the nozzle 51 provided in the processing fluid supply unit 50 is inserted is provided in the center of the top plate 41. A processing fluid such as a film forming material is supplied from the opening 411 to the center of the wafer W. The top plate 41 includes a heating unit 412.

The deoxidized atmosphere maintaining unit 40 may change the distance between the top plate 41 and the wafer W by moving up and down the arm 42 using the drive unit 43. Specifically, the deoxidized atmosphere maintaining unit 40 moves the top plate 41 between a processing position where the top plate 41 is close to the surface of the wafer W and covers the upper side of the wafer W and a retracted position where the top plate 41 is spaced apart from the surface of the wafer W and opens the upper side of the wafer W.

The processing fluid supply unit 50 includes a nozzle 51, an arm 52 that horizontally supports the nozzle 51, and a drive unit 53 that turns and moves up and down the arm 52.

The nozzle 51 is connected to an oxide film removing liquid supply source 112 via a flow rate regulator 111. The oxide film removing liquid supplied from the oxide film removing step liquid supply source 112 is an etching liquid that can remove an oxide film such as a natural oxide film formed on the first material M1. As such an etching liquid, for example, dilute hydrochloric acid is used.

The nozzle 51 is connected to the rinsing liquid supply source 122 via a flow rate regulator 121. The rinsing liquid supplied from the rinsing liquid supply source 122 is, for example, DIW.

In addition, the nozzle 51 is connected to the film forming processing liquid supply source 132 via a flow rate regulator 131 and a heating unit 133. The film forming processing liquid supplied from the film forming processing liquid supply source 132 is, for example, a solution obtained by diluting a film forming material with an organic solvent such as, for example, IPA. As the film forming material, for example, thiol, disulfide, or thiocyanate is used. The film forming processing liquid supplied from the film forming processing liquid supply source 132 is ejected from the nozzle 51 in the state in which the film forming processing liquid is heated to a desired temperature by the heating unit 133, specifically, a temperature of 25° C. or higher.

There is a possibility that oxygen is dissolved in the oxide film removing liquid, the rinsing liquid, the organic solvent, and the film forming processing liquid. Here, from the viewpoint of suppressing the oxidation of the surface of the first material M1, it is preferable that the oxygen concentration in the oxide film removing liquid, the rinsing liquid, the organic solvent, and the film forming processing liquid is low. Accordingly, in the substrate processing apparatus 14 according to the embodiment, the deoxidized oxide film removing liquid, the rinsing liquid, the organic solvent, and the film forming processing liquid are used. This makes it possible to more reliably suppress the oxidation of the surface of the first material M1. The substrate processing apparatus 14 may include a deoxidizing unit that reduces the oxygen concentration in the oxide film removing liquid, the rinsing liquid, the organic solvent, and the film forming processing liquid by bubbling using an inert gas such as, for example, nitrogen.

In addition, the nozzle 51 is connected to the rinsing liquid supply source 142 via a flow rate regulator 141. The etching liquid supplied from the etching liquid supply source 142 is an etching that is capable of removing the reaction product P (see, for example, FIG. 2). As such an etching liquid, for example, a fluorine-based etching liquid such as, for example, a hydrogen fluoride liquid, an ammonium fluoride liquid, or an ammonium hydrogen fluoride liquid, is used.

In addition, the nozzle 51 is connected to a reducing agent liquid supply source 152 via a flow rate regulator 151. As described above, the reducing agent supplied from the reducing agent liquid supply source 152 is a reducing agent that is capable of remove the film formed on the surface of the first material M1. As such a reducing agent, for example, DTT, 2-mercaptoethanol, 2-mercaptoethylamine hydrochloride, or TCEP-HCl is used. Each of the flow rate regulators 111, 121, 131, 141, and 151 includes, for example, an opening/closing valve, a flow rate control valve, a flow rate meter.

An example in which the substrate processing apparatus 14 includes a single nozzle 51 is illustrated herein, but the substrate processing apparatus 14 may include a plurality of nozzles may be configured to eject, for example, the oxide film removing liquid and the film forming processing liquid from separate nozzles.

The lower supply unit 60 includes an under plate 61 inserted through the main body 31 of the substrate holding mechanism 30 and disposed below the wafer W, and a drive unit 62 that moves up and down the under plate 61.

The under plate 61 is a member formed in a size that covers the rear surface of the wafer W. Inside the under plate 61, a flow path 611 penetrating the under plate 61 vertically is formed. A heating fluid supply source 602 is connected to the flow path 611 via a flow rate regulator 601. The heating fluid supplied from the heating fluid supply source 602 is used to heat the wafer W. As the heating fluid, for example, an inert gas such as, for example, nitrogen, is used. The heating fluid may be a heated liquid.

The lower supply unit 60 supplies the heating fluid supplied from the heating fluid supply source 602 to the rear surface of the wafer W by ejecting the heating fluid from the flow path 611 of the under plate 61. This makes it possible to heat the wafer W to a desired temperature, specifically, a temperature of 25° C. or higher.

The recovery cup 70 is disposed to surround the substrate holding mechanism 30 and collects the processing liquid scattered from the wafer W by the rotation of the main body 31 and the holding member 32 of the substrate holding mechanism 30. A drain port 71 is formed in the bottom portion of the recovery cup 70, and the processing liquid collected by the recovery cup 70 is discharged from the drain port 71 to the outside of the substrate processing apparatus 14. In addition, an exhaust port 72 for discharging the downflow gas supplied from the FFU 21 to the outside of the substrate processing apparatus 14 is formed in the bottom portion of the recovery cup 70.

(4. Specific Operation of Substrate Processing Apparatus)

Figure 5:
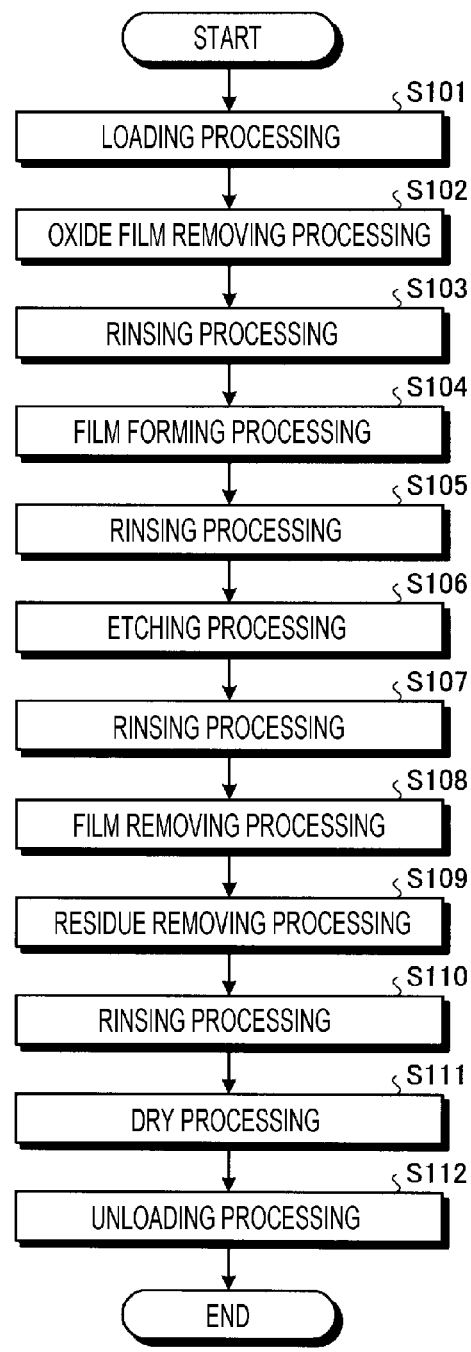
FIG. 5 is a flowchart illustrating a procedure of a processing executed by the substrate processing system according to the embodiment.
Figure 6:
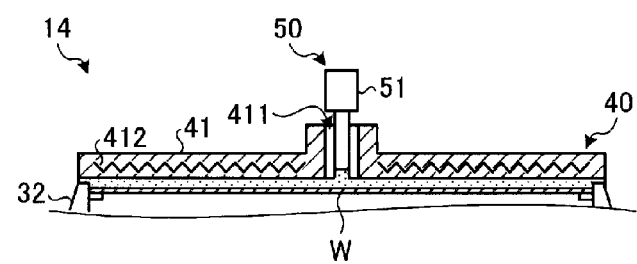
FIG. 6 is a view illustrating an exemplary arrangement of a top plate and a nozzle according to the embodiment.
Figure 7:
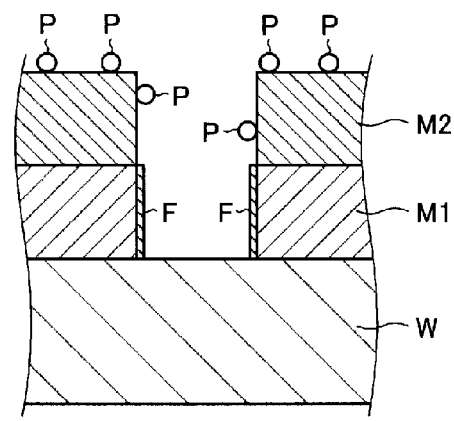
FIG. 7 is a view illustrating an exemplary wafer after a film forming processing.
Figure 8:
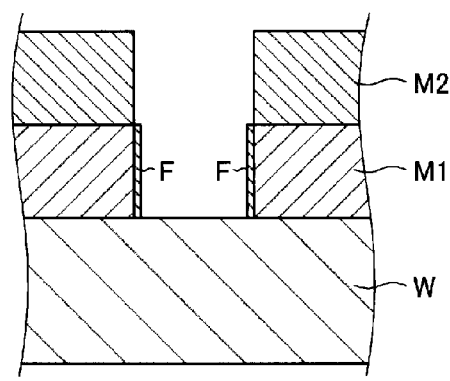
FIG. 8 is a view illustrating an exemplary wafer after an etching processing.
Figure 9:
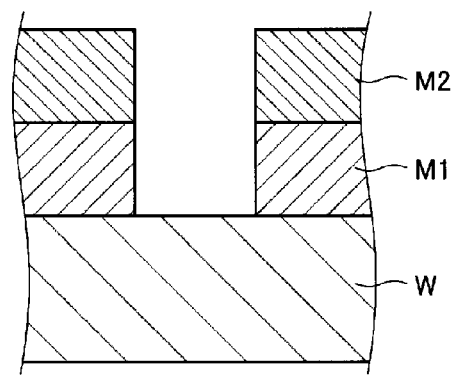
FIG. 9 is a view illustrating an exemplary wafer after a film removing processing.

Next, a specific operation of the substrate processing apparatus 14 will be described with reference to FIGS. 5 to 9. FIG. 5 is a flowchart illustrating a procedure of a processing executed by the substrate processing system 1 according to the embodiment. FIG. 6 is a view illustrating an exemplary arrangement of a top plate 41 and a nozzle 51 according to the embodiment. FIG. 7 is a view illustrating an exemplary wafer W after a film forming processing, FIG. 8 is a view illustrating an exemplary wafer W after a film forming processing, and FIG. 9 is a view illustrating an exemplary wafer W after a film removing processing. Each apparatus included in the substrate processing system 1 executes each processing procedure illustrated in FIG. 5 according to the control of the controller 15.

As illustrated in FIG. 5, in the substrate processing apparatus 14, first, a loading processing is performed (step S101). In the loading processing, a wafer W loaded into a chamber 20 by the substrate transfer device 301 (see, for example, FIG. 1) is held by the substrate holding mechanism 30. The wafer W is held by the holding member 32 in the state in which a forming surface illustrated in FIG. 2 faces upward. Thereafter, the main body 31 and the holding member 32 are rotated by the drive unit 33. Thereby, the wafer W rotates together with the holding member 32.

Subsequently, in the substrate processing apparatus 14, an oxide film removing processing is performed (step S102). In the oxide film removing processing, first, the top plate 41 of the deoxidized atmosphere maintaining unit 40 is disposed at the processing position. In addition, the nozzle 51 of the processing fluid supply unit 50 is inserted through the opening 411 of the top plate 41. Then, the oxide film removing liquid is supplied from the nozzle 51 to the surface of the wafer W by opening the valve of the flow rate regulator 111 for a predetermined time. The oxide film removing liquid supplied to the surface of the wafer W spreads over the entire surface of the wafer W as the wafer W rotates. As a result, as illustrated in FIG. 6, the space between the wafer W and the top plate 41 is filled with the oxide film removing liquid. By supplying the oxide film removing liquid to the surface of the wafer W, it is possible to remove the oxide film formed on the surface of the first material M1. This makes it possible to suitably form a film on the surface of the first material M1 in the subsequent film forming processing.

Subsequently, in the substrate processing apparatus 14, a rinsing processing is performed (step S103). In the rinsing processing, the rinsing liquid is supplied from the nozzle 51 to the surface of the wafer W by opening the valve of the flow rate regulator 121 for a predetermined time. The rinsing liquid supplied to the surface of the wafer W spreads over the entire surface of the wafer W as the wafer W rotates. As a result, the oxide film removing liquid on the wafer W is removed from the wafer W by the rinsing liquid, and the space between the wafer W and the top plate 41 is filled with the rinsing liquid.

Subsequently, in the substrate processing apparatus 14, a film forming processing is performed (step S104). In the film forming processing, the valve of the flow rate regulator 131 is opened for a predetermined time, whereby a heated film forming processing liquid is supplied from the nozzle 51 to the surface of the wafer W. The film forming processing liquid supplied to the surface of the wafer W spreads over the entire surface of the wafer W by the rotation of the wafer W. As a result, the space between the wafer W and the top plate 41 is filled with the film-forming processing liquid. Then, by supplying the film forming processing liquid to the surface of the wafer W, a film F is formed on the surface of the first material M1 by supplying the film forming processing liquid to the surface of the wafer W (see, for example, FIG. 7). Thereafter, the top plate 41 of the deoxidized atmosphere maintaining unit 40 moves from above the wafer W to the retracted position.

As described above, the substrate processing apparatus 14 according to the embodiment is configured to maintain the atmosphere which is in contact with the surface of the wafer in a deoxidized atmosphere by filling the space between the wafer W and the top plate 41 with the oxide film removing liquid, the rinsing liquid, or the film forming processing liquid until the film forming processing is completed. Thus, since an oxide film is suppressed from being formed on the surface of the first material M1, it is possible to suitably form a film F on the surface of the first material M1 in the film forming processing.

In addition, since the film forming processing liquid is supplied to the wafer W in the state of being heated by the heating unit 133, it is possible to suitably form the film F on the surface of the first material M1 in a short time compared with the case where the film forming processing liquid is not heated. In addition, the substrate processing apparatus 14 may heat the film forming processing liquid on the wafer W using the heating unit 412 provided in the top plate 41. In addition, the substrate processing apparatus 14 may also heat the wafer W by supplying a heating fluid from the lower supply unit 60. As a result, since it is possible to maintain the processing temperature during the film forming processing at a desired temperature, it is possible to more suitably form the film F on the first material M1. Here, an example in which the top plate 41 includes the heating unit 412 has been described. However, it is only necessary to be able to adjust the processing temperature during the film forming processing, and the top plate may be configured to include a temperature adjusting unit having a cooling function in addition to the heating function.

In addition, it is possible to suppress the liquid remaining on the lower surface of the top plate 41 from dropping and adhering to the surface of the wafer W by moving the top plate 41 of the deoxidized atmosphere maintaining unit 40 from the upper side of the wafer W to the retracted position after the film forming processing. Without being limited thereto, the substrate processing apparatus 14 may be configured to include, for example, a tray configured to receive liquid falling from the top plate 41 and a drive unit configured to move the tray. In this case, after the top plate 41 is raised, the tray is moved between the top plate 41 and the wafer W. This makes it possible to suppress the liquid falling from the top plate 41 from adhering to the surface of the wafer W.

In the film forming processing, the substrate processing apparatus 14 may be configured such that the film forming processing liquid that stays in the space between the top plate 41 and the surface of the wafer W may be discharged by continuously supplying the film forming processing liquid from the processing fluid supply unit 50. When the liquid stays in the space between the top plate 41 and the surface of the wafer W for a long time, oxygen may dissolve in the staying liquid, and the dissolved oxygen may reach the surface of the first material M1 due to, for example, diffusion, thereby oxidizing the surface of the material M1. Whereas, it is possible to suppress oxygen from reaching the surface of the first material M1 by discharging the liquid staying on the surface of the wafer W by continuously supplying the film forming processing liquid.

The substrate processing apparatus 14 may perform a replacement processing of replacing the rinsing liquid on the wafer W with an organic solvent such as, for example, IPA having high affinity with the film forming processing liquid after the rinsing processing and before the film forming processing. In this case, the nozzle 51 may be connected to an organic solvent supply source via a flow rate regulator. In addition, the substrate processing apparatus 14 may be configured such that a heated rinsing liquid is supplied to the rear surface of the wafer W from the lower supply unit 60 in the film forming processing. This makes it possible to suppress the wraparound of the film forming processing liquid to the rear surface of the wafer W.

Subsequently, in the substrate processing apparatus 14, a rinsing processing is performed (step S105). In the rinsing processing, the rinsing liquid is supplied from the nozzle 51 to the surface of the wafer W by opening the valve of the flow rate regulator 121 for a predetermined time. The rinsing liquid supplied to the surface of the wafer W spreads over the entire surface of the wafer W as the wafer W rotates. Thus, the film forming processing liquid on the wafer W is removed from the wafer W by the rinsing liquid.

Subsequently, in the substrate processing apparatus 14, an etching processing is performed (step S106). In the etching processing, the etching liquid is supplied from the nozzle 51 to the surface of the wafer W by opening the valve of the flow rate regulator 141 for a predetermined time. The etching liquid supplied to the surface of the wafer W spreads over the entire surface of the wafer W as the wafer W rotates. Thus, the reaction product P is removed from the surface of the wafer W (see, for example, FIG. 8).

In this etching processing, the surface of the first material M1 is protected by the film F. For this reason, with the substrate processing apparatus 14, it is possible to suppress the first material M1 from being scraped by the etching liquid.

Subsequently, in the substrate processing apparatus 14, a rinsing processing is performed (step S107). In the rinsing processing, the rinsing liquid is supplied from the nozzle 51 to the surface of the wafer W by opening the valve of the flow rate regulator 121 for a predetermined time. The rinsing liquid supplied to the surface of the wafer W spreads over the entire surface of the wafer W as the wafer W rotates. Thus, the etching liquid on the wafer W is removed from the wafer W by the rinsing liquid.

Subsequently, in the substrate processing apparatus 14, a film removing processing is performed (step S108). In the film removing processing, a reducing agent is supplied from the nozzle 51 to the surface of the wafer W by opening the valve of the flow rate regulator 151 for a predetermined time. The reducing agent supplied to the surface of the wafer W spreads over the entire surface of the wafer W as the wafer W rotates. Thus, the film F formed on the surface of the first material M1 is removed (see, for example, FIG. 9).

As described above, the film F is selectively formed on the first material M1 among the first material M1 and the second material M2. In other words, the film F is not formed on a material other than the first material M1, for example, the second material M2. Accordingly, with the substrate processing apparatus 14, the film removing processing is easy compared with the case where a film is formed in the entire surface of the wafer W.

Subsequently, in the substrate processing apparatus 14, a residue removing processing is performed (step S109). The residue removing processing is performed in order to remove the film F that could not be removed in the previous film removing processing. In such a residue removing processing, for example, the etching liquid used in the oxide film removing processing is supplied to the surface of the wafer W by opening the valve of the flow rate regulator 111 for a predetermined time. The etching liquid supplied to the surface of the wafer W spreads over the entire surface of the wafer W as the wafer W rotates. This makes it possible to remove the film F remaining on the surface of the first material M1 by the etching liquid. Such a residue removing processing may be omitted.

Subsequently, in the substrate processing apparatus 14, a rinsing processing is performed (step S110). In the rinsing processing, the rinsing liquid is supplied from the nozzle 51 to the surface of the wafer W by opening the valve of the flow rate regulator 121 for a predetermined time. The rinsing liquid supplied to the surface of the wafer W spreads over the entire surface of the wafer W as the wafer W rotates. Thus, the etching liquid on the wafer W is removed from the wafer W by the rinsing liquid.

Subsequently, in the substrate processing apparatus 14, a dry processing is performed (step S111). In the dry processing, for example, by increasing the number of rotations of the wafer W, the rinsing liquid remaining on the surface of the wafer W is shaken off to dry the wafer W.

Subsequently, in the substrate processing apparatus 14, an unloading processing is performed (step S112). In the unloading processing, the wafer W is taken out from the chamber 20 of the substrate processing apparatus 14 by the substrate transfer device 301 (see, for example, FIG. 1). Thereafter, the wafer W is accommodated in a carrier C placed on the carrier placing section 11 via the delivery unit 202 and the substrate transfer device 201. When the unloading processing is completed, the processing for one wafer W is completed.

(5. Modification of Processing Fluid Supply Unit)

Figure 10:
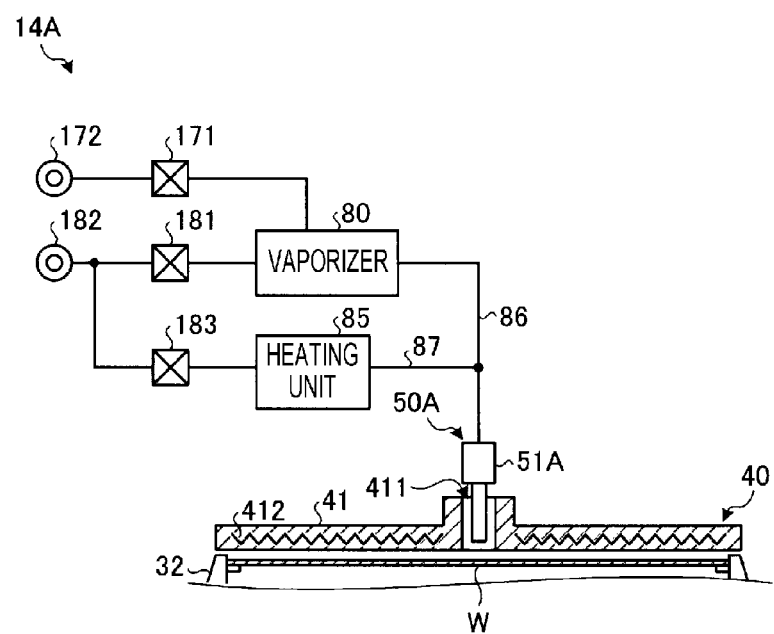
FIG. 10 is a view illustrating a configuration of a processing fluid supply unit according to a first modification.

In the embodiment described above, the film forming material is supplied to the wafer W in a liquid state. Without being limited thereto, the film forming material may be supplied to the wafer W in the state of a gas. The modification in this case will be described with reference to FIG. 10. FIG. 10 is a view illustrating a configuration of a processing fluid supply unit according to a first modification.

As illustrated in FIG. 10, a substrate processing apparatus 14A according to the first modification includes a processing fluid supply unit 50A. A vaporizer 80 is connected to the nozzle 51A of the processing fluid supply unit 50A. The vaporizer 80 is connected to a film forming material supply source 172 via a flow rate regulator 171. In addition, the vaporizer 80 is connected to an inert gas supply source 182 via a flow rate regulator 181.

The vaporizer 80 changes a film forming material (e.g., 100% thiol liquid) supplied from the film forming material supply source 172 from a liquid state to a gas state (vapor). The vaporizer 80 mixes the vapor of the film forming material with an inert gas (e.g., nitrogen) supplied from the inert gas supply source 182 and supplies the mixture to the nozzle 51A.

A heating unit 85 is connected to the nozzle 51A of the processing fluid supply unit 50A. The vaporizer 85 is connected to the inert gas supply source 182 via a flow rate regulator 183. The heating unit 85 heats the inert gas supplied from the inert gas supply source 182 to a desired temperature, specifically, a temperature of 25° C. or higher, and supplies the heated inert gas to a pipe 86 connecting the vaporizer 80 and the nozzle 51A. This makes it possible to heat the vapor of the film forming material supplied to the nozzle 51A to a desired temperature. In addition, a heating unit may be provided in the pipe 86 connecting the vaporizer 80 and the nozzle 51A and a pipe connecting the heating unit 85 and the pipe 86. This makes it easy to maintain the temperature of the vapor of the film forming material at a desired temperature.

In the film forming processing, the substrate processing apparatus 14A according to the first modification supplies the vapor of the film forming material to the surface of the wafer W from the nozzle 51A by opening the flow rate regulators 171, 181, and 183 for a predetermined time. Thus, since the space between the wafer W and the top plate 41 is filled with the vapor of the film forming material, it is possible to form a film on the first material M1 in a deoxidized atmosphere. In addition, in the substrate processing apparatus 14A, the temperature of the vapor of the film forming material supplied to the wafer W may be maintained at a desired temperature by a heating unit 412 provided on the top plate 41.

As described above, in the substrate processing apparatus 14A, the film forming material may be supplied in a gaseous state to the wafer W in the film forming processing.

When the boiling point of the film forming material is low, the substrate processing apparatus 14A does not necessarily need to include the vaporizer 80. Here, an example in which an inert gas as a carrier gas is mixed with 100% vapor of the film forming material has been described. However, in the substrate processing apparatus 14A, 100% vapor of the film forming material may be supplied to the surface of the wafer W from the nozzle 51A without being mixed with the inert gas.

(6. Modification of Top Plate (Part 1))

Figure 11:
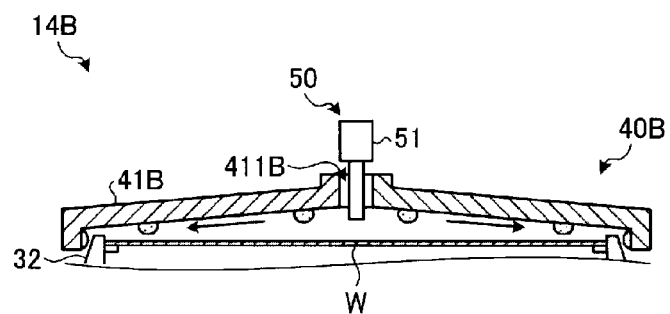
FIG. 11 is a view illustrating a configuration of a deoxidized atmosphere maintaining unit according to a second modification.

FIG. 11 is a view illustrating a configuration of a deoxidized atmosphere maintaining unit according to a second modification. As illustrated in FIG. 11, a substrate processing apparatus 14B according to the second modification includes a deoxidized atmosphere maintaining unit 40B. The deoxidized atmosphere maintaining unit 40B includes a top plate 41B, and an opening 411B through which the nozzle 51 provided in the processing fluid supply unit 50 is inserted is provided in the center of the top plate 41B.

The top plate 41B according to the second modification has an inclined surface that inclines downward from the opening 411B provided in the center toward the outer peripheral portion. In addition, the outer peripheral portion of the top plate 41B is located outward of the holding member 32 in the radial direction of the wafer W.

In the embodiment described above, for example, in the film forming processing, the rear surface of the top plate 41 is brought into contact with a liquid such as, for example, a film forming processing liquid. In this case, the liquid may remain on the rear surface of the top plate 41. The liquid remaining on the rear surface of the top plate 41 may fall on the surface of the wafer W, thereby adversely affecting the wafer W.

Accordingly, the substrate processing apparatus 14B according to the second modification is provided with a top plate 41B having a lower surface inclined downward from the center toward the outer peripheral portion. This makes it possible to suppress the liquid from falling on the surface of the wafer W, even if the liquid remains on the lower surface of the top plate 41B since the remaining liquid moves to the outer peripheral portion of the top plate 41B along the lower surface of the top plate 41B. In addition, since the outer peripheral portion of the top plate 41B is located radially outward of the wafer W with respect to the holding member 32, there is no possibility that the liquid that has reached the outer peripheral portion of the top plate 41B falls on the wafer W.

As described above, with the substrate processing apparatus 14B according to the second modification, when the lower surface of the top plate 41B is brought into contact with a liquid such as, for example, a film forming processing liquid, it is possible to suppress the liquid remaining on the lower surface of the top plate 41B from falling on the surface of the wafer W.

The lower surface of the top plate 41B may be formed of a water-repellent member of, for example, polytetrafluoroethylene (PTFE) or perfluoroalkoxy alkane (PFA). Alternatively, the lower surface of the top plate 41B may be coated with a water repellent member of, for example, PTFE or PFA. This may make it difficult for the liquid to remain on the lower surface of the top plate 41B. In addition, it is possible to make the liquid remaining on the lower surface of the top plate 41B efficiently move to the outer peripheral portion of the top plate 41B. Accordingly, it is possible to more reliably suppress the liquid remaining on the lower surface of the top plate 41B from falling on the surface of the wafer W.

(7. Modification of Top Plate (Part 2))

Figure 12:
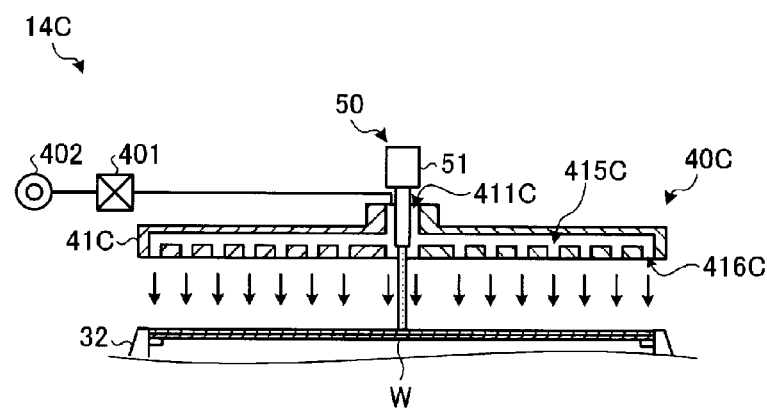
FIG. 12 is a view illustrating a configuration of a deoxidized atmosphere maintaining unit according to a third modification.

FIG. 12 is a view illustrating a configuration of a deoxidized atmosphere maintaining unit according to a third modification. As illustrated in FIG. 12, a substrate processing apparatus 14C according to the second modification includes a deoxidized atmosphere maintaining unit 40C. The deoxidized atmosphere maintaining unit 40C includes a top plate 41C. An opening 411C through which the nozzle 51 provided in the processing fluid supply unit 50 is inserted is provided in the center of the top plate 41C.

Inside the top plate 41C, an internal space 415C and a plurality of ejection ports 416C communicating with the internal space 415C are formed, and an inert gas supply source 402 is connected to the internal space 415C via a flow rate regulator 401.

The top plate 41C according to the third modification is configured as described above, and an inert gas such as, for example, nitrogen supplied from the inert gas supply source 402 is supplied from the plurality of ejection ports 416C to the entire surface of the wafer W via the internal space 415C.

As described above, in the substrate processing apparatus 14C according to the third modification, the inert gas is supplied to the surface of the wafer W from substantially the entire lower surface of the top plate 41C that is arranged to correspond to the surface of the wafer W. This may make it easy to maintain the atmosphere which is in contact with the surface of the wafer W in the deoxidized atmosphere without bringing the top plate 41C into contact with the liquid.

(8. UV Irradiation Unit)

Figure 13:
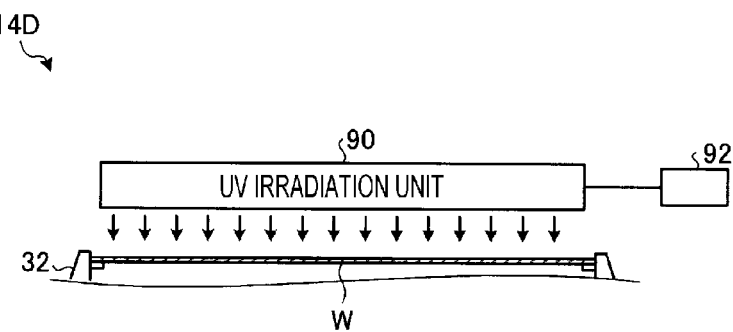
FIG. 13 is a view illustrating a configuration of a substrate processing apparatus according to a fourth modification.

FIG. 13 is a view illustrating a configuration of a substrate processing apparatus according to a fourth modification. As illustrated in FIG. 13, a substrate processing apparatus 14D according to the fourth modification includes a UV irradiation unit 90. The UV irradiation unit 90 is connected to a drive unit 92 and is movable by the drive unit 92 between a processing position at which the UV irradiation unit 90 faces the surface of the wafer W and a retracted position outside the wafer W. At the processing position, the UV irradiation unit 90 irradiates the entire surface of the wafer W with ultraviolet rays.

For example, in the substrate processing apparatus 14D according to the fourth modification, an impurity removing processing using the UV irradiation unit 90 may be performed after the unloading processing (step S101) and before the oxide film removing processing (step S102). In the impurity removing processing, after the UV irradiation unit 90 is moved to the processing position, the UV irradiation unit 90 irradiates the surface of the wafer W with ultraviolet rays. This makes it possible to suitably form a film on the surface of the first material M1 in the subsequent film forming processing by removing impurities such as, for example, organic substances adhering to the surface of the wafer W.

In addition, in the substrate processing apparatus 14D, the film removing processing (step S108) may be performed using the UV irradiation unit 90. In this case, after the rinsing processing (step S107), the UV irradiation unit 90 is moved to the processing position, and the surface of the wafer W is irradiated with ultraviolet rays from the UV irradiation unit 90. This makes it possible to remove the film F formed on the surface of the first material M1.

(9. Other Modifications)

In the above-described embodiment, the deoxidized atmosphere is locally formed using the deoxidized atmosphere maintaining units 40, 40B, and 40C. For example, the substrate processing apparatus may form a deoxidized atmosphere in the entire chamber 20 by supplying an inert gas such as, for example, nitrogen from the FFU 21.

In the above-described embodiment, a processing for removing a reaction product generated by, for example, dry etching has been described as an example of a surface treatment. However, the surface treatment is not limited to such a processing. For example, the surface treatment may be plating for forming a film such as, for example, a barrier metal on the surface of a substrate in the field of photolithography.

In the field of photolithography, with respect to, for example, a substrate on which a first material such as, for example, copper wiring, and a second material such as, for example, an interlayer insulating film, are exposed, it may be desired to form a film only on the surface of the second material. In such a case, in the prior art, first, a film is formed on the surfaces of both the first material and the second material by plating, and then the film formed on the surface of the first material is removed by, for example, dry etching. However, with this method, there is a possibility that even the film formed on the surface of the second material and the first material are etched.

In contrast, in the substrate processing method according to the present application, before the surface treatment is performed, a film forming material is supplied to the surface of the substrate so as to selectively form a film on the surface of the first material which is a metal surface. This makes it possible to suppress an unnecessary film from being formed on the surface of the first material in the surface treatment. Accordingly, compared with the prior art, it is possible to form a desired film only on the second material without damaging the film formed on the surface of the second material or the first material. In addition, according to the substrate processing method of the present application, the film formed on the surface of the first material may be removed by supplying a reducing agent to the surface of the substrate or by irradiating the surface of the substrate with ultraviolet rays.

In addition, uniform plating is enabled by performing the oxide film removing processing and plating in a deoxidized atmosphere. Thus, performing the oxide film removing processing and the film forming processing in a deoxidized atmosphere is also effective in plating. Accordingly, in the substrate processing method according to the present application, the film formed on the surface of the first material by supplying the film forming material may be a metal film formed by plating. Specifically, the film may be a metal film including any one of gold, platinum, silver, copper, zinc, cadmium, tin, nickel, chromium, and cobalt.

The surface treatment may be a surface treatment in directed self-assembly lithography (DSA). For example, a film is selectively formed on the first material by supplying the film forming material according to the present application to a substrate. Here, by supplying a material containing a polymer such as, for example, polymethyl methacrylate (PMMA) as a film forming material in addition to sulfur atoms, the function of the polymer such as, for example, PMMA, may be added to the film formed on the surface of the first material. This makes it possible to modify the surface of the first material to a surface having a desired function. Thereafter, as the surface treatment, a pattern is formed on the surface of the substrate by supplying a block copolymer (BCP) to the surface of the substrate, and then the film formed on the surface of the first material is removed.

In the above-described embodiment, an example in which the first material includes at least one of gold, silver, copper, platinum, palladium, iron, nickel, zinc, cobalt, and ruthenium has been described. The first material is not limited thereto, and may be, for example, tungsten. Sulfur atoms do not adhere to the surface of tungsten. Accordingly, when the first material contains tungsten, it is preferable to supply a material having Si—N bonds (direct bonds between silicon atoms and nitrogen atoms) to the surface of the substrate as a film forming material. For example, when trimethylsilyldimethylamine (TMSDMA) is used as a film forming material, dimethylamine (—N(CH3)2) is bonded to tungsten contained in the first material, whereby a film is formed on the surface of the first material.

As described above, the substrate processing method according to the embodiment includes a maintaining step, a supplying step (e.g., a film forming processing), a surface treatment step (e.g., an etching processing), and a removing processing (e.g., a film removing processing). In the maintaining step, at least the atmosphere, which is in contact with a substrate (e.g., a wafer W) in which a first material (e.g., the first material M1) that is a metal and a second material (e.g., the second material M2) that is a material other than the first material are exposed on the surface, is maintained as a deoxidized atmosphere. In the supplying step, a film forming material, which selectively forms a film with respect to the first material and the second material, is supplied to the surface of the substrate in the state in which the substrate is maintained in the deoxidized atmosphere by the maintaining step. In the surface treatment step, a surface treatment of the substrate is performed in the state in which a film is formed on the surface of the first material by the supplying step. In the removing step, the film is removed from the surface of the first material after the surface treatment step.

Accordingly, with the substrate processing method according to the embodiment, since the surface treatment of the second material is performed in the state in which the film is formed on the surface of the first material, it is possible to improve the selectivity of the surface treatment with respect to a substrate on which a plurality of types of materials are exposed.

In addition, the metal in the first material may include at least one of gold, silver, copper, platinum, palladium, iron, nickel, zinc, cobalt, and ruthenium. In this case, the film forming material may contain sulfur atoms. This makes it possible to suitably form a film on the surface of the first material containing at least one of gold, silver, copper, platinum, palladium, iron, nickel, zinc, cobalt, and ruthenium.

The film forming material may be a deoxidized liquid or gas that contains sulfur atoms. By using the deoxidized liquid or gas as the film forming material, oxidation of the surface of the first material is suppressed. Thus, it is possible to suitably form a film on the surface of the first material.

In addition, the substrate processing method according to the embodiment may include an oxide film removing step (e.g., an oxide film removing processing). In the oxide film removing step, the oxide film is removed from the surface of the first material in the state of being maintained in the deoxidized atmosphere by the maintaining step before the supplying step. In this way, by removing the oxide film from the surface of the first material, it is possible to suitably form a film on the surface of the first material in the subsequent supplying step.

The oxide film removing step may include a chemical liquid supplying step and a rinsing step. In the chemical liquid supplying step, a deoxidized chemical liquid (e.g., a deoxidized oxide film removing liquid) is supplied. In the rinsing step, a deoxidized rinsing liquid (e.g., deoxidized DIW) is supplied. This makes it possible to reliably suppress the oxidation of the surface of the first material.

In addition, the substrate processing method according to the embodiment may include an organic substance removing step. In the organic substance removing step, the organic substance is removed from the surface of the first material before the oxide film removing step. This make it possible to suitably form a film on the surface of the first material in the subsequent supplying step by removing impurities such as, for example the organic substance adhering to the surface of the substrate.

In the removing step, the film may be removed from the surface of the first material using a reducing agent. This makes it possible to suitably remove the film from the surface of the first material.

In the removing step, the film may be removed from the surface of the first material by irradiating the film with ultraviolet rays. This makes it possible to suitably remove the film from the surface of the first material.

In addition, the substrate processing method according to the embodiment may include a residue removing step. In the residue removing step, the film remaining on the surface of the first material is removed by supplying an etching liquid to the surface of the first material after the removing step. This makes it possible to remove the film remaining on the surface of the first material.

In addition, the supplying step may be performed in the state in which at least one of the surface of the substrate and the film forming material is heated. By performing the supplying step in the state in which at least one of the surface of the substrate and the film forming material is heated, it is possible to shorten the time required for the supplying step.

The metal may contain tungsten. In this case, the film forming material may be a liquid or gas containing molecules having Si—N bonds. This makes it possible to suitably form a film on the surface of the first material containing tungsten.

The film formed on the surface of the first material may be a metal film formed by plating. Thus, uniform plating is enabled by performing plating in a deoxidized atmosphere.

In addition, the substrate processing apparatus according to the embodiment includes a maintaining unit (e.g., the deoxidized atmosphere maintaining unit 40), a supply unit (e.g., the processing fluid supply unit 50), a surface treatment unit (e.g., the processing fluid supply unit 50), and a removing unit (e.g., the processing fluid supply unit 50). The maintaining unit maintains at least the atmosphere, which is in contact with a substrate (e.g., a wafer W) in which a first material (e.g., the first material M1) that is a metal and a second material (e.g., the second material M2) that is a material other than the first material are exposed on the surface, as a deoxidized atmosphere. The supply unit supplies a film forming material, which selectively forms a film on the first material among the first material and the second material, to the surface of the substrate in the state in which the substrate is maintained in the deoxidized atmosphere by the maintaining unit. The surface treatment unit performs a surface treatment of the second material in the state in which the film is formed on the surface of the first material by the supply unit. The removing unit removes the film from the surface of the first material after the surface treatment.

Accordingly, with the substrate processing apparatus according to the embodiment, since the surface treatment of the second material is performed in the state in which the film is formed on the surface of the first material, it is possible to improve the selectivity of the surface treatment with respect to a substrate on which a plurality of types of materials are exposed.

In addition, the maintaining unit may include a top plate (e.g., the top plate 41, 41B, or 41C) and a drive unit 43. The top plate is formed in a size that covers the surface of the substrate. The drive unit moves the top plate to a processing position at which the top plate is close to the surface of the substrate and faces the surface of the substrate. In this case, the supply unit may supply the film forming material to the space between the top plate disposed at the processing position and the surface of the substrate. This makes it possible to efficiently maintain a local space including the surface of the substrate in a deoxidized atmosphere.

Moreover, the top plate may be provided with a temperature adjusting unit. This makes it possible to maintain the processing temperature during the film forming processing at a desired temperature. Thus, it is possible to more suitably form a film on the first material.

The supply unit may supply a liquid film forming material. In this case, the processing position may be a position at which the lower surface of the top plate is in contact with the liquid film forming material supplied from the supply unit. This makes it possible to suppress an oxide film from being formed on the first material by shielding the surface of the first material from the outside air. Accordingly, it is possible to suitably form a film on the surface of the first material in the film forming processing.

In addition, the supply unit may discharge the film forming material staying in the space between the top plate and the surface of the substrate by continuously supplying the liquid film forming material (e.g., a film forming processing liquid). When the liquid stays in the space between the top plate and the surface of the substrate for a long time, oxygen may dissolve in the staying liquid, and the dissolved oxygen may reach the surface of the first material due to, for example, diffusion, thereby oxidizing the surface of the material. Whereas, it is possible to prevent oxygen from reaching the surface of the first material by discharging the liquid staying on the surface of the substrate by continuously supplying the liquid film forming material.

In addition, after supplying of the liquid film forming material is completed, the drive unit 43 may move the top plate to the retracted position where the top plate is retracted from above the substrate. This makes it possible to suppress the liquid remaining on the lower surface of the top plate from falling on and adhering to the surface of the substrate.

In addition, the top plate may have a lower surface inclined downward from the center toward the outer peripheral portion thereof. As a result, even if the liquid remains on the lower surface of the top plate, the remaining liquid moves to the outer peripheral portion of the top plate along the lower surface of the top plate. Thus, it is possible to suppress the liquid from falling on the surface of the substrate while suppressing enlargement of the apparatus.

In addition, the top plate may include a plurality of ejection ports (e.g., the ejection ports 416C) configured to eject an inert gas (e.g., nitrogen). This makes it easy to maintain the atmosphere which is in contact with the surface of the substrate in the deoxidized atmosphere without bringing the top plate into contact with the liquid.

According to the present disclosure, it is possible to improve the selectivity of a surface treatment for a substrate on which a plurality of types of materials are exposed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:
1. A substrate processing method comprising:
   maintaining an atmosphere in contact with at least a surface of a substrate on which a first material that is a metal and a second material that is a material other than the first material are exposed, as a deoxidized atmosphere;
   supplying a film forming material, which selectively forms a film on the first material among the first material and the second material, to the surface of the substrate in a state where the deoxidized atmosphere is maintained by the maintaining;
   performing a surface treatment of the second material in a state where the film is formed on a surface of the first material supplied in the supplying the film forming material; and
   removing the film from the surface of the first material after the performing the surface treatment,
   wherein the metal includes tungsten and at least one of gold, silver, copper, platinum, palladium, iron, nickel, zinc, cobalt, and ruthenium and the film forming material contains sulfur atoms and a liquid or gas containing a molecule having a Si—N bond.

2. The substrate processing method according to claim 1, wherein the film forming material is a deoxidized liquid or gas that contains sulfur atoms.

3. The substrate processing method according to claim 1, further comprising:
   removing an oxide film from the surface of the first material in a state where the deoxidized atmosphere is maintained by the maintaining before the supplying the film forming material.

4. The substrate processing method according to claim 3, wherein the removing the oxide film includes supplying a deoxidized chemical liquid, and a supplying a deoxidized rinsing liquid.

5. The substrate processing method according to claim 3, further comprising:
   removing an organic material from the surface of the first material before the removing the oxide film.

6. The substrate processing method according to claim 1, wherein, in the removing the film from the surface of the first material, the film is removed from the surface of the first material using a reducing agent.

7. The substrate processing method according to claim 6, further comprising:
   removing the film remaining on the surface of the first material by supplying an etching liquid to the surface of the first material after the removing the film from the surface of the first material.

8. The substrate processing method according to claim 1, wherein, in the removing the film from the surface of the first material, the film is removed from the surface of the first material by irradiating a surface of the first material with ultraviolet rays.

9. The substrate processing method according to claim 1, wherein the supplying the film forming material is performed in a state where at least one of the surface of the substrate and the film forming material is heated.

10. The substrate processing method according to claim 1, wherein the film formed on the surface of the first material is a metal film formed by plating.

* * * * *